(12) United States Patent
Lin et al.

(10) Patent No.: US 8,053,025 B2
(45) Date of Patent: Nov. 8, 2011

(54) MIXED-TYPED HETEROJUNCTION THIN-FILM SOLAR CELL STRUCTURE AND METHOD FOR FABRICATING THE SAME

(75) Inventors: Ching-Fuh Lin, Taipei (TW); Chieh-Yu Hsiao, Taipei (TW); Jiun-Jie Chao, Taipei (TW)

(73) Assignee: National Taiwan University, Taipei (TW)

( * ) Notice: Subject to any disclaimer, the term of this patent is extended or adjusted under 35 U.S.C. 154(b) by 363 days.

(21) Appl. No.: 12/222,691

(22) Filed: Aug. 14, 2008

(65) Prior Publication Data
US 2009/0293946 A1  Dec. 3, 2009

(30) Foreign Application Priority Data
Jun. 3, 2008  (TW) .............................. 97120597 A

(51) Int. Cl.
*B05D 5/12* (2006.01)
*B29C 65/00* (2006.01)
(52) U.S. Cl. ......... 427/74; 156/73.1; 156/182; 156/242; 156/245; 156/247; 136/263
(58) Field of Classification Search .................. 427/74, 427/534; 136/263; 156/73.1, 182, 242, 245, 156/247
See application file for complete search history.

(56) References Cited

U.S. PATENT DOCUMENTS

| 6,098,052 | A | 8/2000 | Kosiba et al. | |
|---|---|---|---|---|
| 7,594,982 | B1* | 9/2009 | Roscheisen et al. | 204/284 |
| 2004/0250848 | A1* | 12/2004 | Sager et al. | 136/252 |
| 2007/0169814 | A1* | 7/2007 | Huck et al. | 136/263 |
| 2008/0176030 | A1* | 7/2008 | Fonash et al. | 428/119 |
| 2008/0210937 | A1* | 9/2008 | Kobayashi et al. | 257/51 |
| 2009/0165844 | A1* | 7/2009 | Dutta | 136/255 |
| 2009/0283145 | A1* | 11/2009 | Kim et al. | 136/261 |

* cited by examiner

*Primary Examiner* — James Lin
(74) *Attorney, Agent, or Firm* — Rosenberg, Klein & Lee

(57) ABSTRACT

The present invention discloses a mixed-type heterojunction thin-film solar cell structure and a method for fabricating the same. Firstly, a conductive substrate and a template are provided, and the template has a substrate and an inorganic wire array formed on the substrate. Next, a conjugate polymer layer is formed on the conductive substrate. Next, the inorganic wire array is embedded into the conjugate polymer layer. Next, the substrate is separated from the inorganic wire array. Then, an electrode layer is formed over the inorganic wire array and the conjugate polymer layer. The solar cell structure of the present invention has advantages of flexibility, high energy conversion efficiency and low fabrication cost.

21 Claims, 20 Drawing Sheets

US 8,053,025 B2

MIXED-TYPED HETEROJUNCTION THIN-FILM SOLAR CELL STRUCTURE AND METHOD FOR FABRICATING THE SAME

BACKGROUND OF THE INVENTION

1. Field of the Invention

The present invention relates to a method for fabricating a solar cell structure, particularly to a mixed-type heterojunction thin-film solar cell structure and a method for fabricating the same.

2. Description of the Related Art

Fossil fuels are going to be exhausted by the end of this century. The search and development for substitute energies, such as wind power, tide power, and biofuel, has been progressing for a period of time. Among them, solar energy has relative higher market acceptability, and many nations have been devoted to the development of solar energy. The German Advisory Council on Global Change predicted that solar energy will provide about 60% of the total energy in 2100. Solar energy is generated by the photovoltaic effect, wherein solar energy material directly converts sunlight into electric energy. The crystalline silicon solar cell has been developed for tens of years, and the related technologies thereof have been very mature. Generally, the monocrystalline silicon solar cell has an energy conversion efficiency of as high as about 20%. However, the fabrication cost thereof is too high to popularize solar energy. The topics of solar energy researches would be developing new materials, processes and systems to promote the energy conversion efficiency and reduce the cost of solar energy.

As to the polymer solar cell, the bi-layer solar energy element containing donors and acceptors was the one used at first. However, the contact area between donors and acceptors is too small to increase the probability of exciton (hole-electron pair) fission. Thus, the performance of this type of polymer solar cell is hard to promote. The solar cell containing the mixed donor material and acceptor material is called the BHJ (bulk heterojunction) cell, which has a greater donor-acceptor contact area than the bi-layer solar cell. Further, the spacing between donors and acceptors is within nanometers, which is near the exciton diffusion length—about 1-10 nm. Thus, the probability of exciton fission increases. The local electric field in the junction, which disjoins charges, originates from the HOMO (Highest Occupied Molecular Orbital) of donors and LUMO (Lowest Unoccupied Molecular Orbital) of acceptors. Therefore, more electrons and holes are disjoined at junctions. Thus is solved the problem of exciton diffusion length in polymer semiconductor. Then, the entire active layer is able to convert light into current. The mixture of donor material and acceptor material is spin-coated on a substrate to form an active layer. However, the two materials are not uniformly distributed in the active layer, which results in the following two cases. One is that there are likely to be paths directly connecting the anode and cathode, decreasing the parallel resistance and increasing leakage current. The other is that there are likely to be isolated areas having none path to the electrodes, wherefore the external circuit cannot collect the current of holes and electrons separated in the isolated areas.

Accordingly, the present invention proposes a mixed-type heterojunction thin-film solar cell structure and a method for fabricating the same to solve the abovementioned problems, whereby solar cells can possess flexibility and high energy conversion efficiency at the same time.

SUMMARY OF THE INVENTION

The primary objective of the present invention is to provide a mixed-type heterojunction thin-film solar cell structure and a method for fabricating the same, whereby solar cells possesses flexibility and high energy conversion efficiency.

Another objective of the present invention is to provide a mixed-type heterojunction thin-film solar cell structure and a method for fabricating the same, which can reduce the cost of solar cells.

To achieve the abovementioned objectives, the present invention proposes a mixed-type heterojunction thin-film solar cell structure and a method for fabricating the same. The method of the present invention comprises steps: providing a conductive substrate and a template, wherein the template has a substrate and an inorganic wire array formed on the substrate; forming a conjugate polymer layer on the conductive substrate; embedding the inorganic wire array into the conjugate polymer layer; separating the substrate from the inorganic wire array; and forming an electrode layer over the inorganic wire array and the conjugate polymer layer.

Below, the embodiments are described in detail in cooperation with the drawings to make easily understood the technical contents, characteristics and efficacies of the present invention.

DETAILED DESCRIPTION OF THE INVENTION

The present invention proposes a solar cell structure, which integrates a conjugate polymer and an inorganic semiconductor nanowire. Conjugate polymer is very suitable for the process of fabricating a large-area, low-cost and flexible solar cell. However, the solar cell containing only conjugate polymer is hard to achieve a high efficiency because conjugate polymer has a low carrier mobility and a narrow sunlight absorption spectrum. Contrarily, inorganic semiconductor has a higher carrier mobility and a higher sunlight absorption ability. For example, a gallium arsenide nanowire array can offset the portion of sunlight absorption spectrum, which the P3HT (poly-3-hexylthiophene) conjugate polymer does not have. Therefore, the solar cell structure of the present invention can possess flexibility and a high energy conversion efficiency simultaneously.

Figure 1:
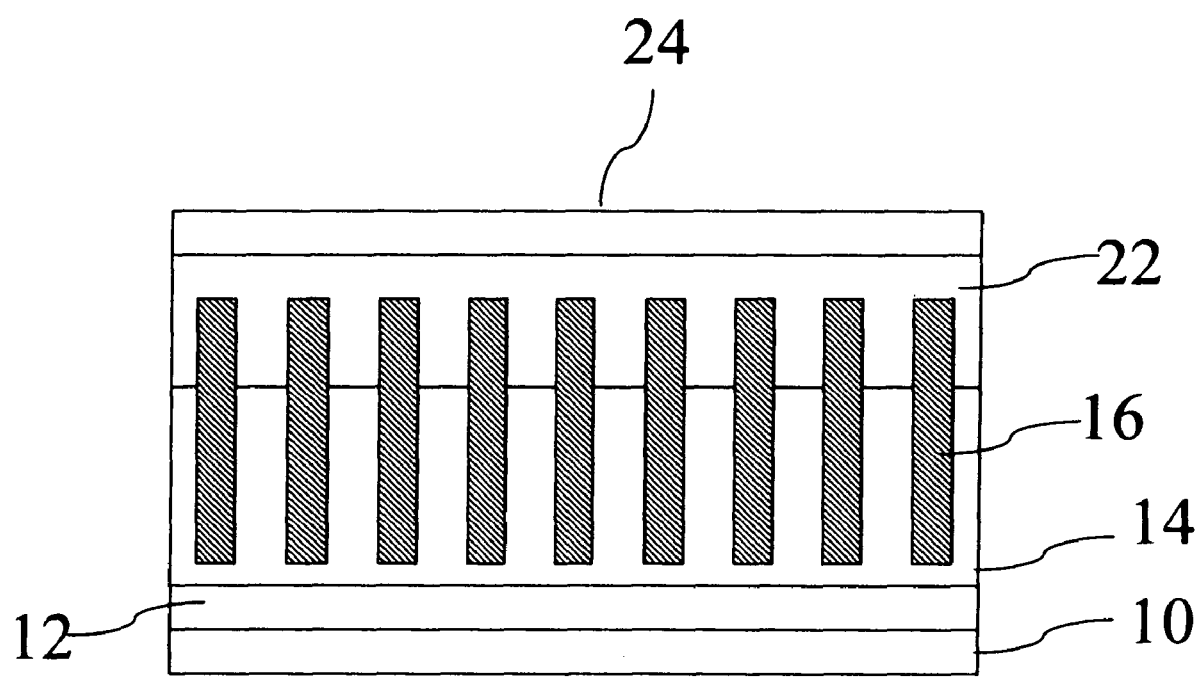
FIG. 1 is a diagram schematically showing a solar cell structure according to one embodiment of the present invention.

Refer to FIG. 1 for a solar cell structure according to the present invention. The solar cell structure of the present invention comprises a conductive substrate 10, a hole transport layer 12 formed on the conductive substrate 10, a conjugate polymer layer 14 formed on the hole transport layer 12, an inorganic wire array 16, such as a nanowire array, inserted into the conjugate polymer layer 14 but not contacting the conductive substrate 10, a hole blocking layer 22 formed on the conjugate polymer layer 14 and covering the conjugate polymer layer 14 and the inorganic wire array 16, and an electrode layer 24 formed on the hole blocking layer 22 and used to provide electricity. Alternatively, an electron-blocking layer is used to replace the hole transport layer 12. Similarly, the electron-blocking layer does not contact the inorganic wire array 16.

In addition to the abovementioned structure, the hole blocking layer 22 may be omitted, and only the electrode layer 24 covers the conjugate polymer layer 14 and the inorganic wire array 16 in the solar cell structure of the present invention.

The inorganic wire array 16 is made of a single element, a binary compound semiconductor or a compound semiconductor containing more than two components. The conjugate polymer layer 14 is made of a material selected from a group consisting of P3HT (poly-3-hexylthiophene), MEHPPV (poly[2-methoxy-5-(2'-ethyl-hexyloxy)-1,4-phenylene vinylene]), PCPDTBT (poly[2,6-(4,4-bis-(2-ethylhexyl)-4H-cyclopenta[2,1-b;3,4-b]-dithiophene) -alt-4,7-(2,1,3-benzothiadiazole)]), $OC_1C_{10}$-PPV (Poly[2-(3,7-dimethyloctyloxy)-5-methoxy-p-phenylene vinylene]), MDMO-PPV (poly[2-methoxy-5-(3',7'-dimethyloctyloxy)-1,4-phenylenevinylene]), and polyfluorene. Among conjugate polymer materials, P3HT has a higher hole mobility. In a PTFT (Polymer Thin-Film Transistor) research, P3HT has a hole mobility of as high as 0.1 cm2/V-sec. General conjugate polymer materials have a hole mobility of only $10^{-1}$-$10^{-7}$cm2/V-sec. A low electron mobility will cause electrons to deposit in the active layer and reduce the efficiency of solar cells. The conductive substrate 10 is made of one of the following materials: a transparent conductive substrate, a transparent-electrode glass substrate, a transparent-electrode plastic substrate, a transparent-electrode quartz substrate and a thin metallic plate. The electrode layer 24 is made of a metal or a transparent-electrode material, such as a material selected from a group consisting of ITO (Indium Tin Oxide), GITO (Gallium Indium Tin Oxide), ZITO (Zinc Indium Tin Oxide), FTO (Fluorine-doped Tin Oxide), ZnO (Zinc Oxide), AZO (Aluminum Zinc Oxide) and IZO (Indium Zinc Oxide). The hole blocking layer 22 is made of a material selected from a group consisting of ZnO (Zinc Oxide), $TiO_x$ (titanium oxide), PCBM ((6,6)-phenyl $C_{61}$ butyric acid methyl ester), LiF (Lithium Fluoride), a calcium compound and an alkali compound, wherein the alkali compounds include $Li_2O$, $LiBO_2$, $K_2SiO_3$, and $Cs_2CO_3$. The hole transport layer 12 is made of a material selected from a group consisting of PEDOT (Poly (3,4-ethylenedioxythiophene)), PEDOT:PSS (Poly(3,4-ethylenedioxythiophene)-poly(styrene sulfonate)), TFB:TPDSi$_2$ (poly[9,9-dioctylfluorene-co-N-[4-(3-methylpropyl)]-diphenylamine]: 4,4'-bis[(p-trichlorosilylpropylphenyl) phenylamino]biphenyl), CuPc (copper phthalocyanine), and TNATA (4,4',4"-tris-N-naphthyl-N-phenylamino-triphenylamine). The electron-blocking layer is made of a material selected from a group consisting of TPD (N,N'-diphenyl-N,N'-di(3-methylphenyl)-1,1'-biphenyl-4,4'-diamine), BFE (poly(9,9-dioctylfluorene-co-N,N'-di(phenyl)-N,N'-di(3-carbo ethoxyphenyl)benzidine), NPB (4,4-bis[N-(1-naphthyl-1-)-N-phenyl-amino]-biphenyl), TPTE (N,N'-diphenyl-N,N'-bis(di(3-methylphenyl)aminobiphenyl)benzidine), a polycarboxy-polymer, a quaternized polyamine-polymer, a polysulphato-polymer, a polysulpho-polymer, and a poly (vinylphosphonic acid). The conjugate polymer layer 14 has a thickness of between 30 nm and 5 µm. Each wire of the inorganic wire array 16 has a length of between 50 nm and 50 µm. The spacing between two wires is below 50 times the width of the wire. The depth by which the wire of the inorganic wire array 16 is inserted into the conjugate polymer layer 14 is between 30 nm and 5 µm.

Figure 2A:
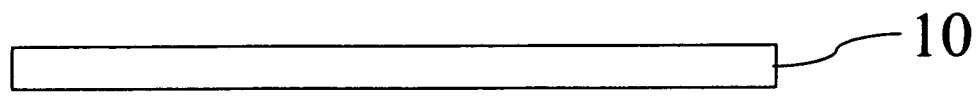
FIGS. 2(a)-2(g) are diagrams schematically showing the steps of fabricating a solar cell structure according to the present invention.
Figure 2B:
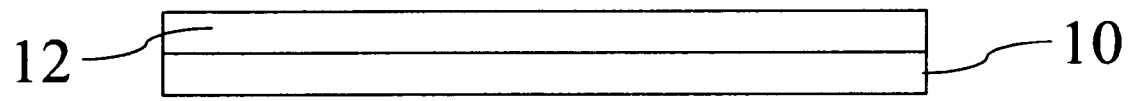
Figure 2C:
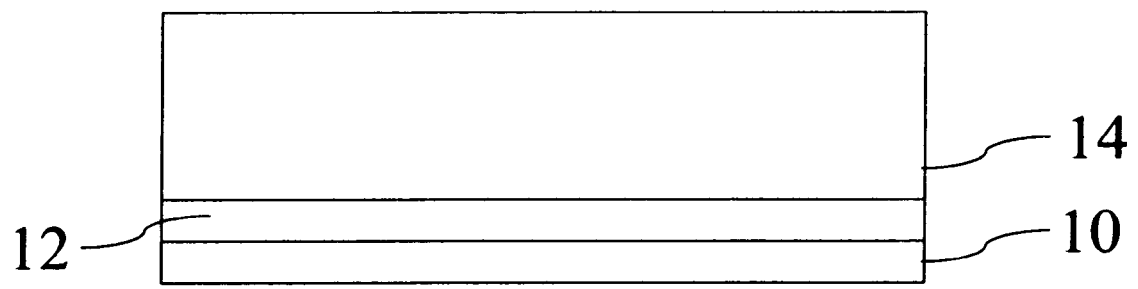
Figure 2D:
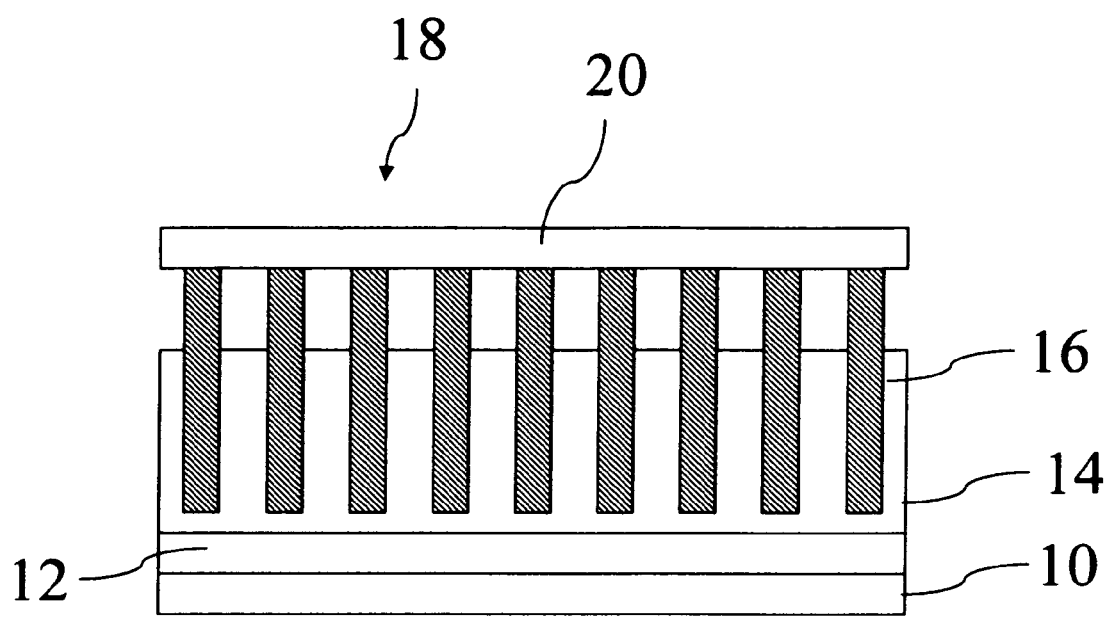
Figure 2E:
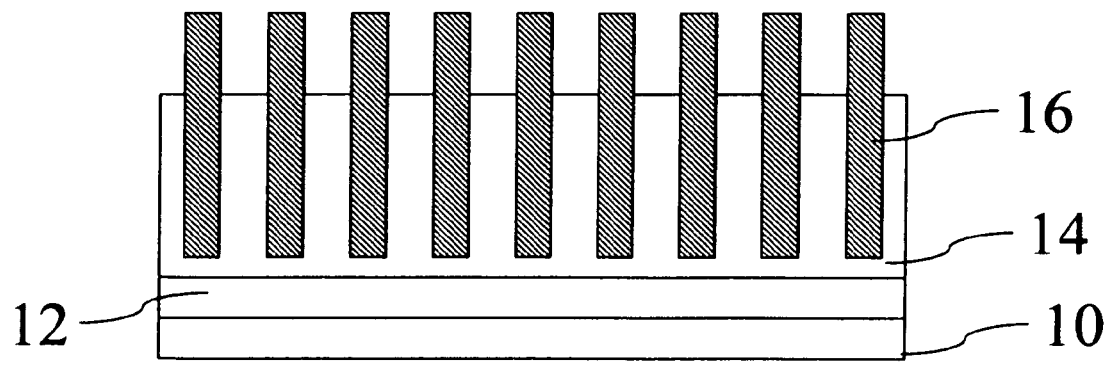
Figure 2F:
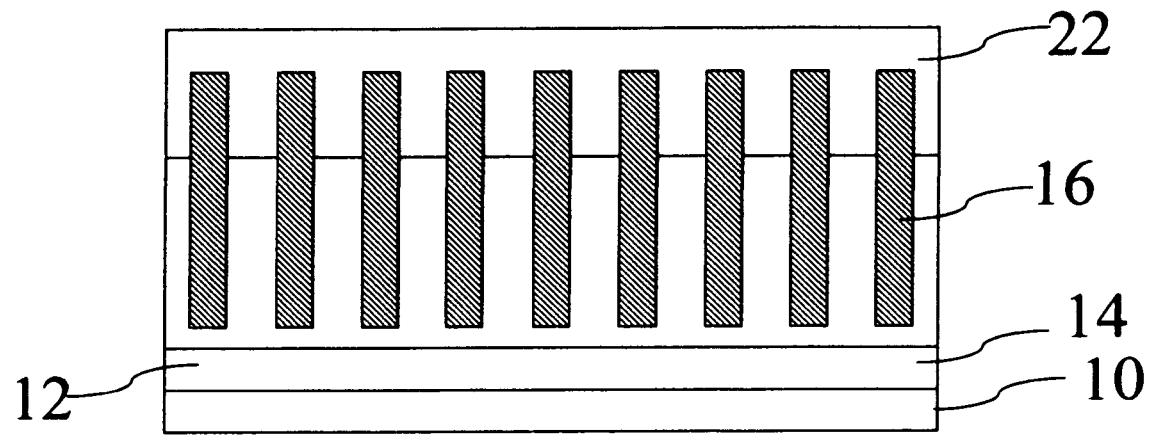
Figure 2G:
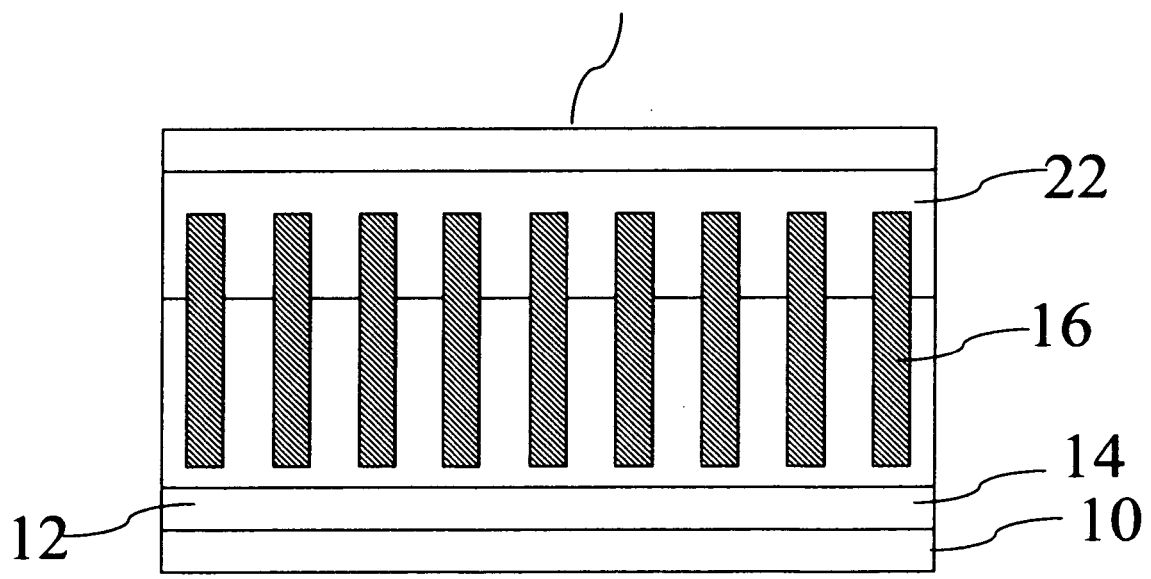

Refer to from FIG. 2(a) to FIG. 2(g) diagrams schematically showing the steps of fabricating the solar cell structure of the present invention. As shown in FIG. 2(a), a conductive substrate 10 is provided firstly. Next, as shown in FIG. 2(b), a hole transport layer 12 is formed on the conductive substrate 10. Next, as shown in FIG. 2(c), a conjugate polymer layer 14 is formed on the hole transport layer 12; the conjugate polymer layer 14 is formed with one of the following methods: spin coating, dip coating, inkjet printing, contact printing, screen printing, evaporation, sputtering, parylene coating, and electrochemical deposition. Next, as shown in FIG. 2(d), a template 18 is provided, and the template 18 contains a semiconductor substrate 20 and an inorganic wire array 16 formed on the semiconductor substrate 20; the inorganic wire array 16 is embedded into the conjugate polymer layer 14. Next, as shown in FIG. 2(e), the semiconductor substrate 20 is separated from the inorganic wire array 16. The inorganic wire array 16 is embedded into the conjugate polymer layer 14 to such a depth that the wires do not contact the hole transport layer 12 or the conductive substrate 10. The spacing of two wires is not limited to but had better be below two times the diffusion length of excitons. The abovementioned spacing is to facilitate exciton fission and reduce the probability of recombination of electrons and holes after the conjugate polymer among the inorganic wire array 16 has absorbed sunlight. The length of the wires of the inorganic wire array 16 should be adjusted according to the absorption coefficient of the inorganic material. In this embodiment, the wire of the inorganic wire array 16 is a nanowire. Next, as shown in FIG. 2(f), a hole blocking layer 22 is formed over the conjugate polymer layer 14 and the inorganic wire array 16 via a spin coating method or a vapor deposition method. The thickness of the hole blocking layer 22 should be limited to below a specified value lest the series resistance of the solar cell be increased and the efficiency be decreased. Next, as shown in FIG. 2(g), an electrode layer 24 is formed on the hole blocking layer 22 via screen printing, vapor deposition, sputtering, or applying silver glue. Thus is completed a solar cell. Alternatively, an electron-blocking layer is used to replace the hole transport layer 12. Similarly, the inorganic wire array 16 does not contact the electron-blocking layer.

The hole blocking layer 22 may be omitted from the abovementioned solar cell structure, and only the electrode layer 24 directly covers the conjugate polymer layer 14 and the inorganic wire array 16. Such a structure can be achieved via cancelling the step shown in FIG. 2(f).

Figure 3:
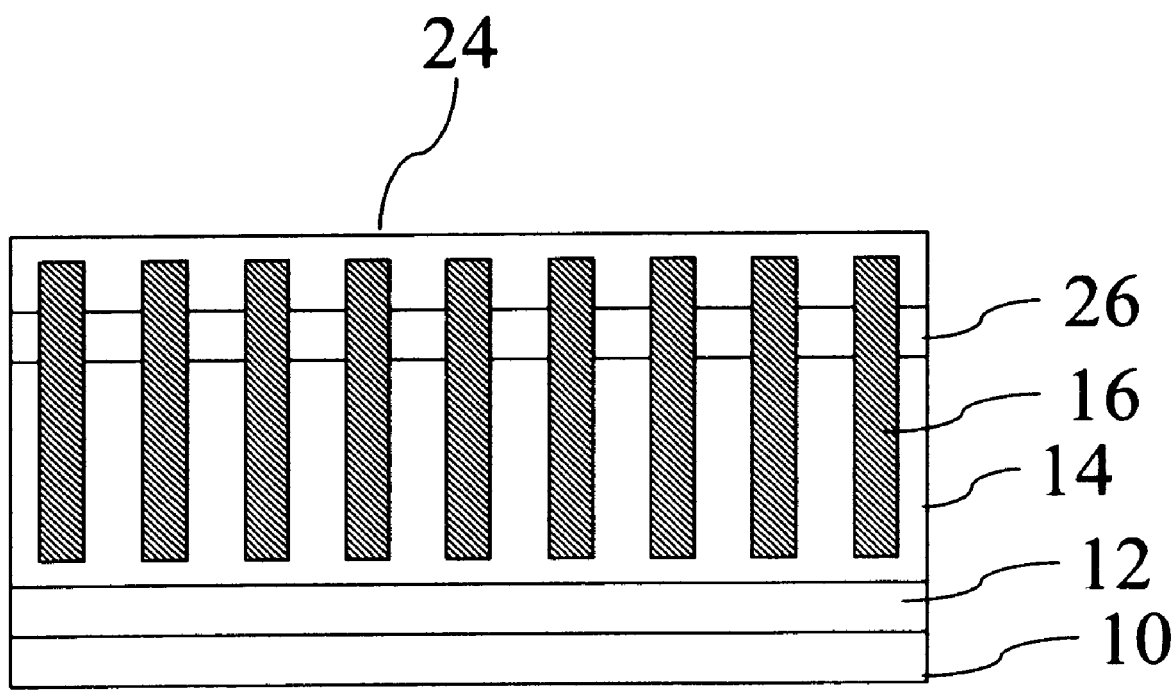
FIG. 3 is a diagram schematically showing a solar cell structure according to another embodiment of the present invention.

Refer to FIG. 1 and FIG. 3. FIG. 3 shows another solar cell structure of the present invention. The structure of FIG. 3 is different from the structure of FIG. 1 in that a non-conductive layer 26 is formed on the conjugate polymer layer 14 to protect the inorganic wire array 16. The non-conductive layer 26 has such a thickness that the inorganic wire array 16 emerging from the conjugate polymer layer 14 is higher than the non-conductive layer 26. Then, the electrode layer 24, which is used to provide electricity, is formed over the non-conductive layer 26 and the inorganic Wire array 16.

The non-conductive layer 26 is made of a transparent material or an opaque material. The transparent material may be one of the following materials: PMMA (polymethylmethacrylate), SOG (Spin-On Glass), $SiO_2$ (silicon dioxide), and $Si_3N_4$ (silicon nitride).

Figure 4A:
FIGS. 4(a)-4(g) are diagrams schematically showing the steps of fabricating another solar cell structure according to the present invention.
Figure 4B:
Figure 4C:
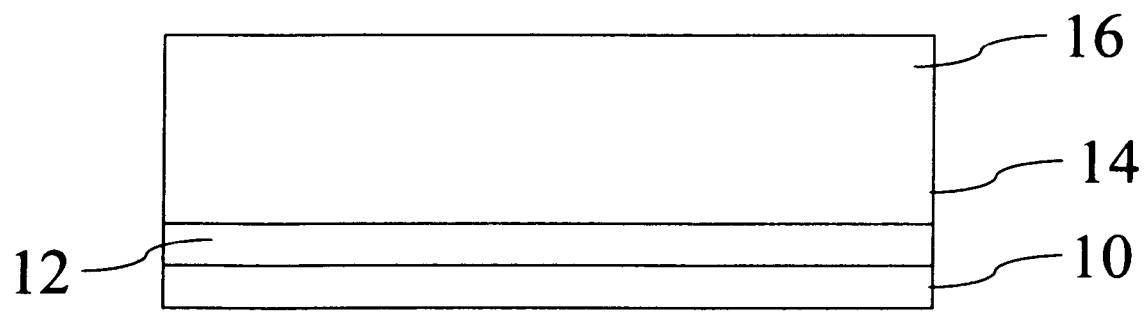
Figure 4D:
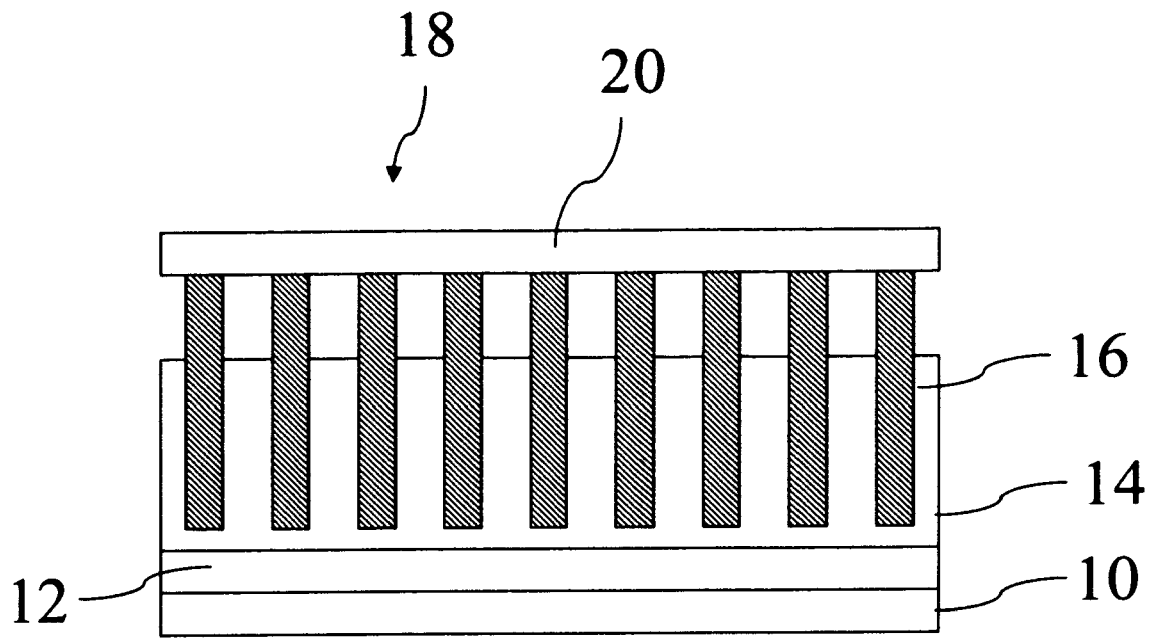
Figure 4E:
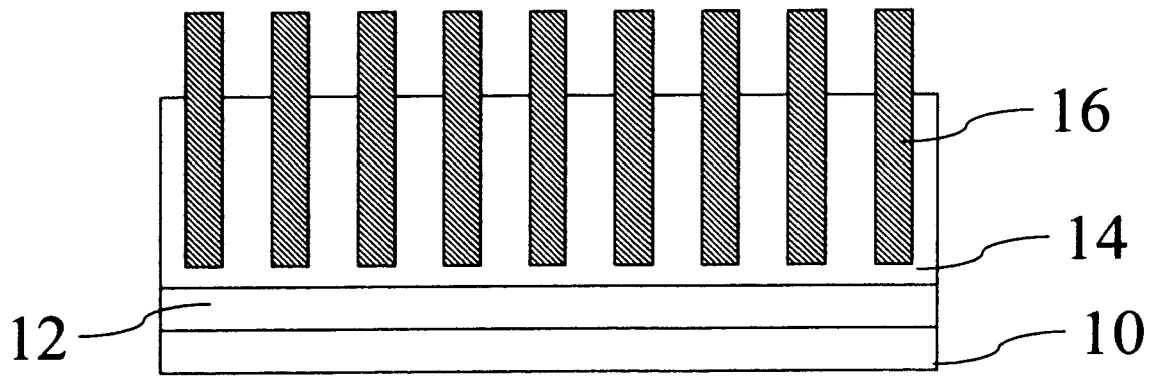
Figure 4F:
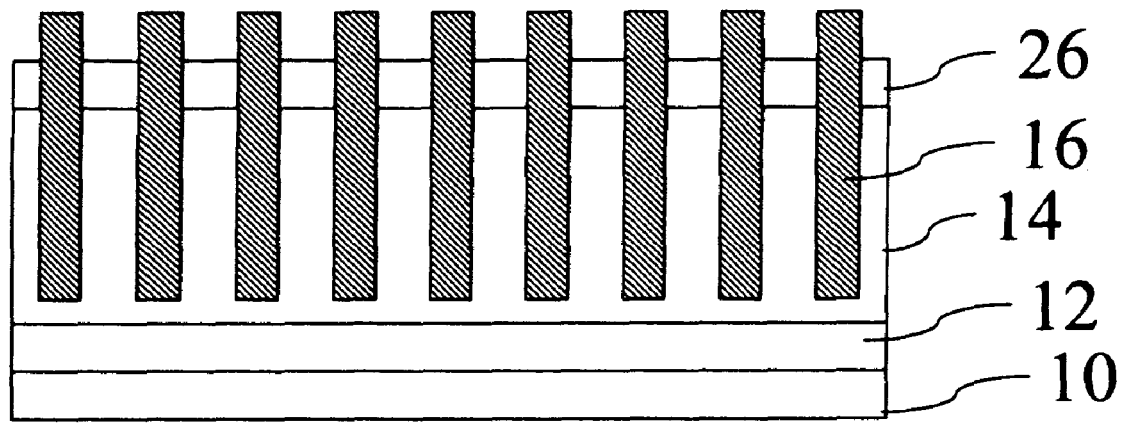
Figure 4G:
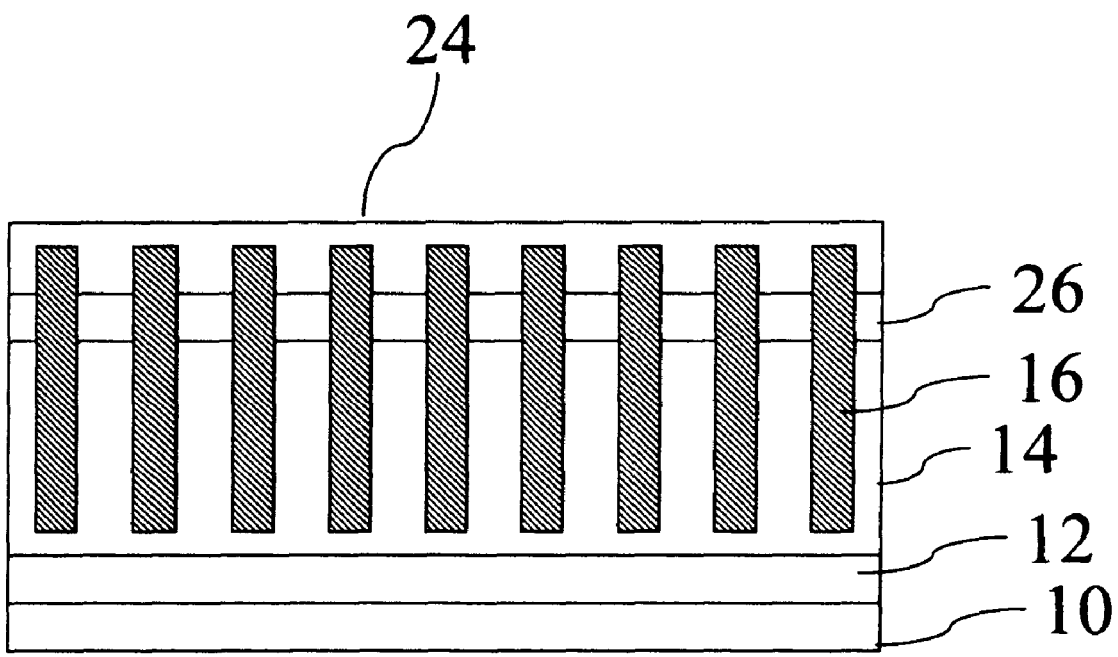

Refer to from FIG. 4(a) to FIG. 4(g) diagrams schematically showing the steps of fabricating the solar cell structure shown in FIG. 3. The steps shown in from FIG. 4(a) to FIG. 4(e) is identical to the steps shown in from FIG. 2(a) to FIG. 2(e), which have been described thereinbefore and will not repeat here. After the structure shown in FIG. 4(e) is completed, a non-conductive layer 26 is formed on the conjugate polymer layer 14 to protect the inorganic wire array 16, as shown in FIG. 4(f); the non-conductive layer 26 may be formed via one of the following methods: spin-coating, vapor deposition, sputtering, and dip coating; then, the non-conductive layer 26 is etched to have such a thickness that the inorganic wire array 16 emerges from the non-conductive layer 26, and the etching is undertaken with a dry etching method or a wet etching method. Next, as shown in FIG. 4(g), an electrode layer 24 is formed over the non-conductive layer 26 and the inorganic wire array 16. Thus is completed a solar cell structure.

Figure 5:
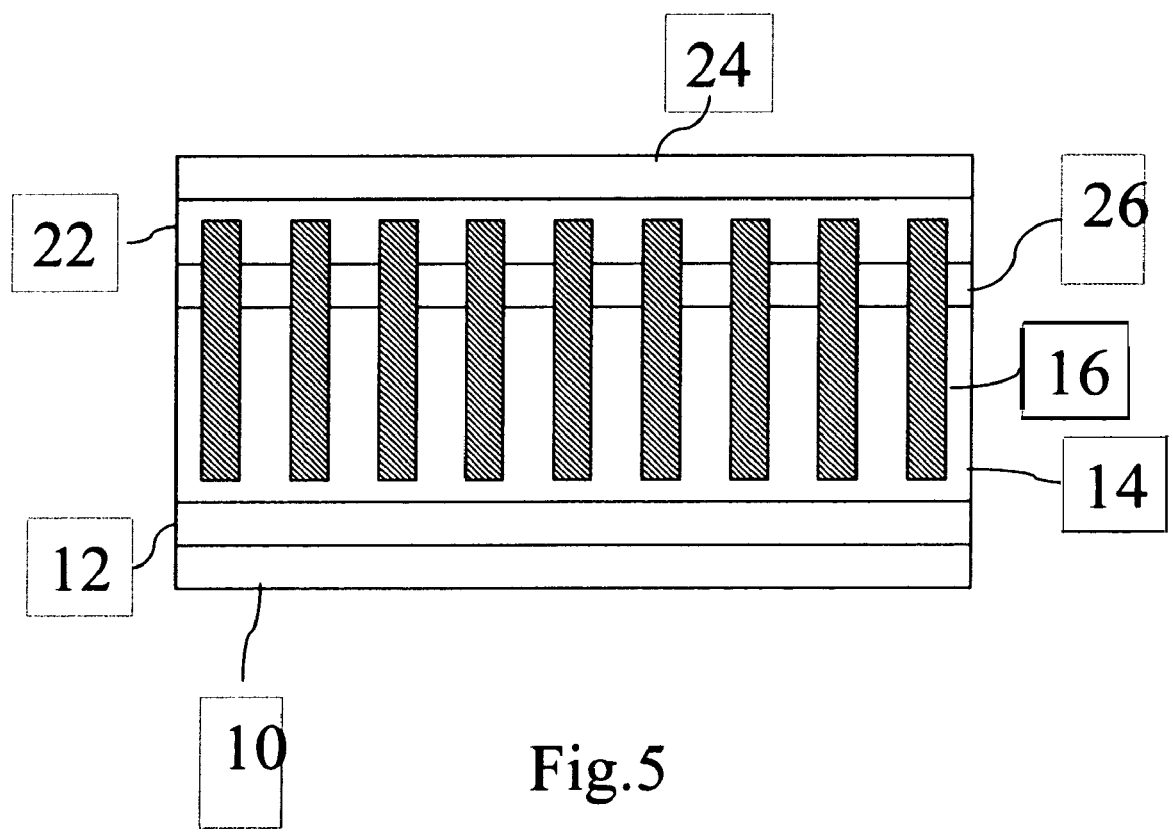
FIG. 5 is a diagram schematically showing a solar cell structure according to a further embodiment of the present invention.

Refer to FIG. 3 and FIG. 5. FIG. 5 shows a further solar cell structure of the present invention. The structure of FIG. 5 is different from the structure of FIG. 3 in that a hole blocking layer 22 is formed on the non-conductive layer 26. Then, an electrode layer 24, which is used to provide electricity, is formed over the hole blocking layer 22.

Figure 6A:
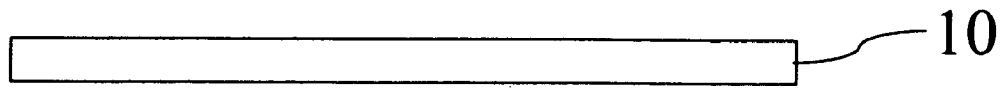
FIGS. 6(a)-6(h) are diagrams schematically showing the steps of fabricating a further solar cell structure according to the present invention.
Figure 6B:
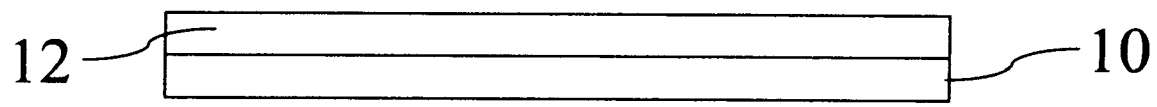
Figure 6C:
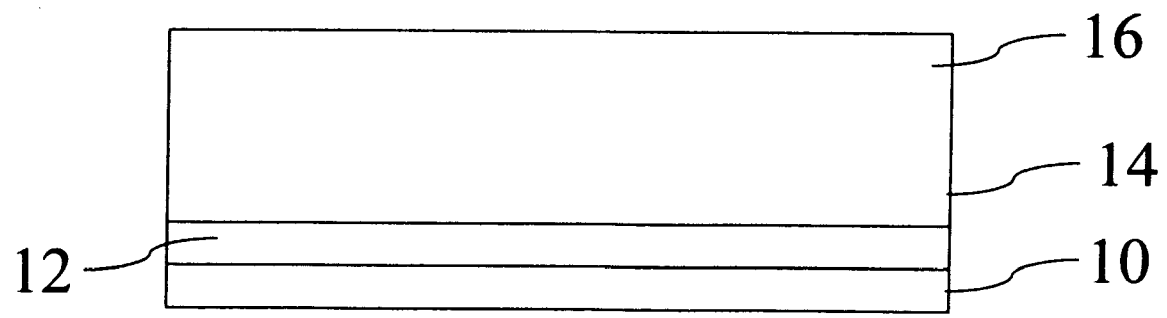
Figure 6D:
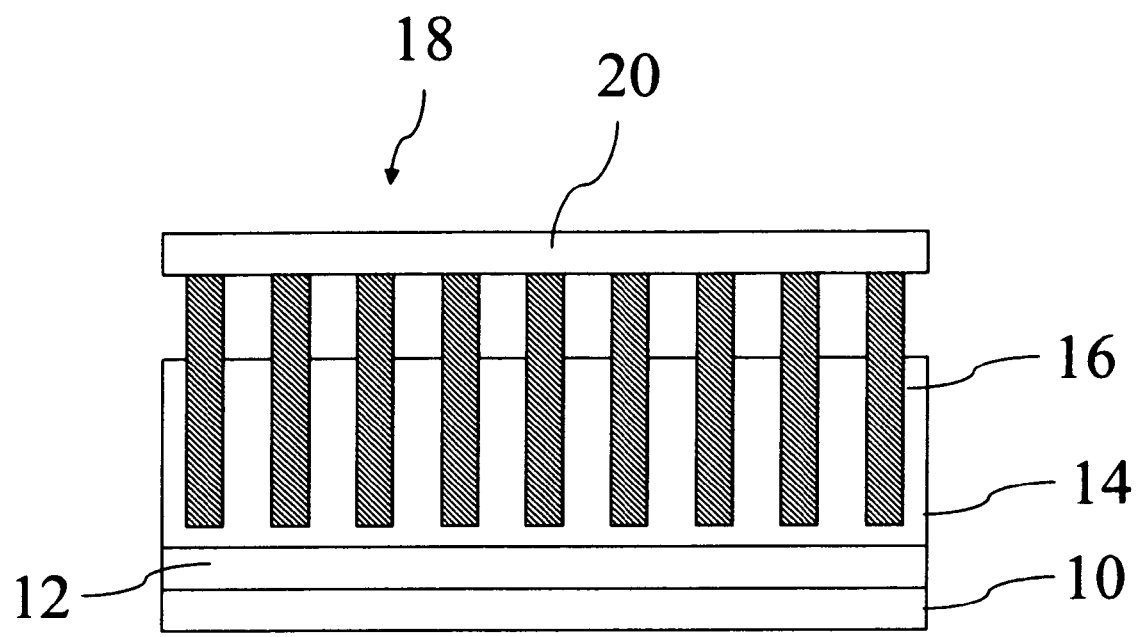
Figure 6E:
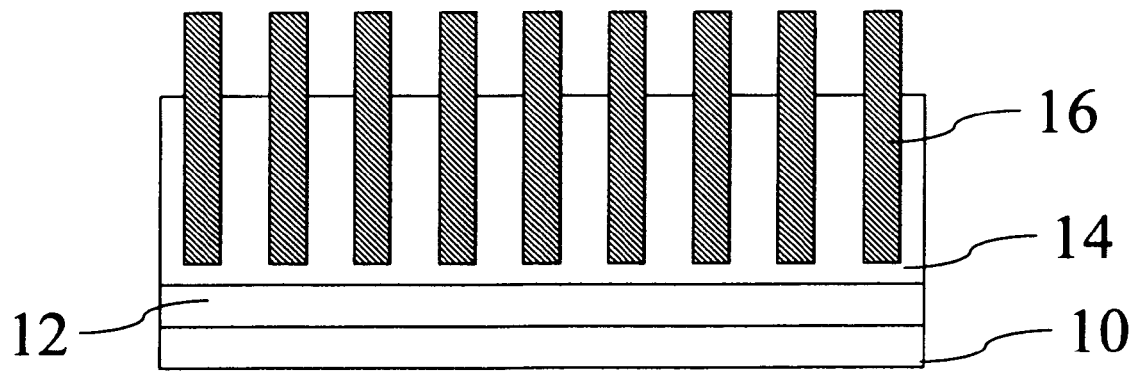
Figure 6F:
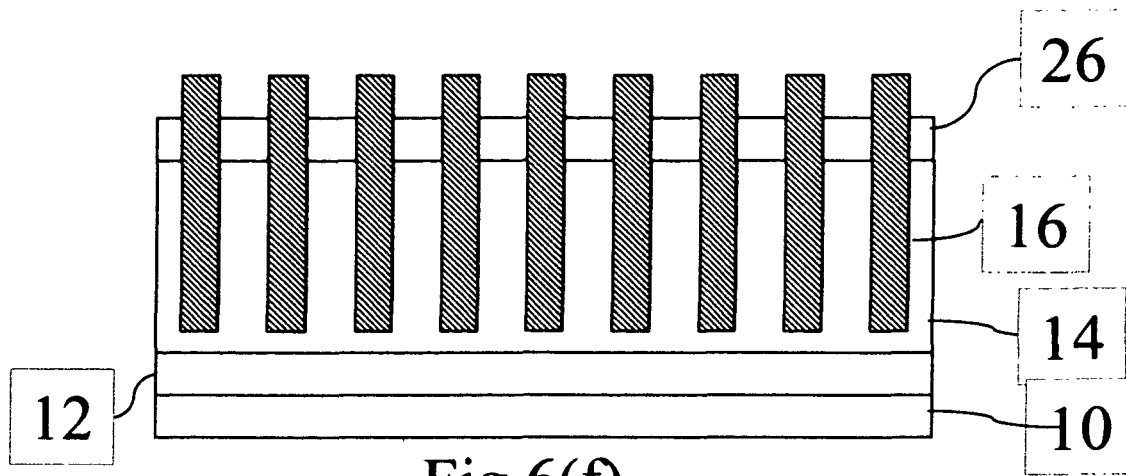
Figure 6G:
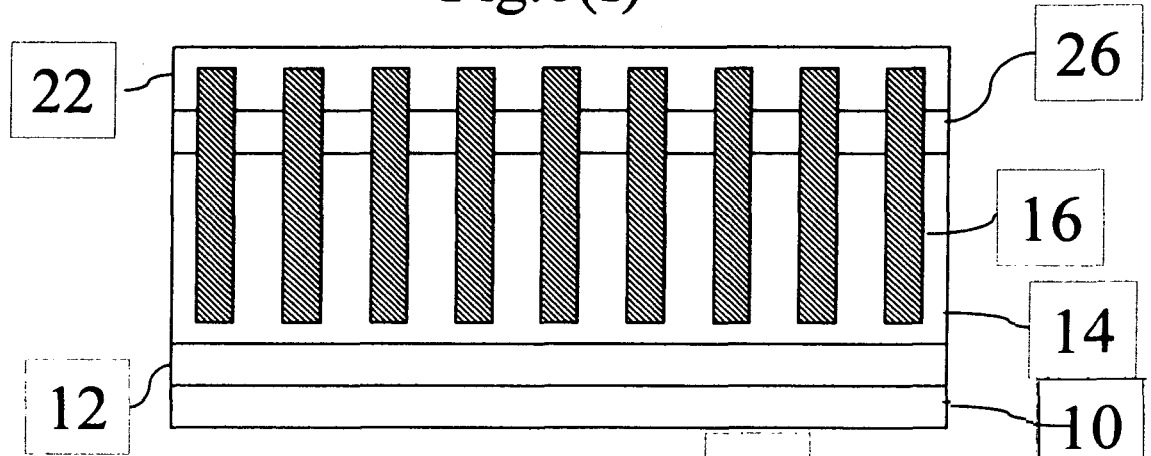
Figure 6H:
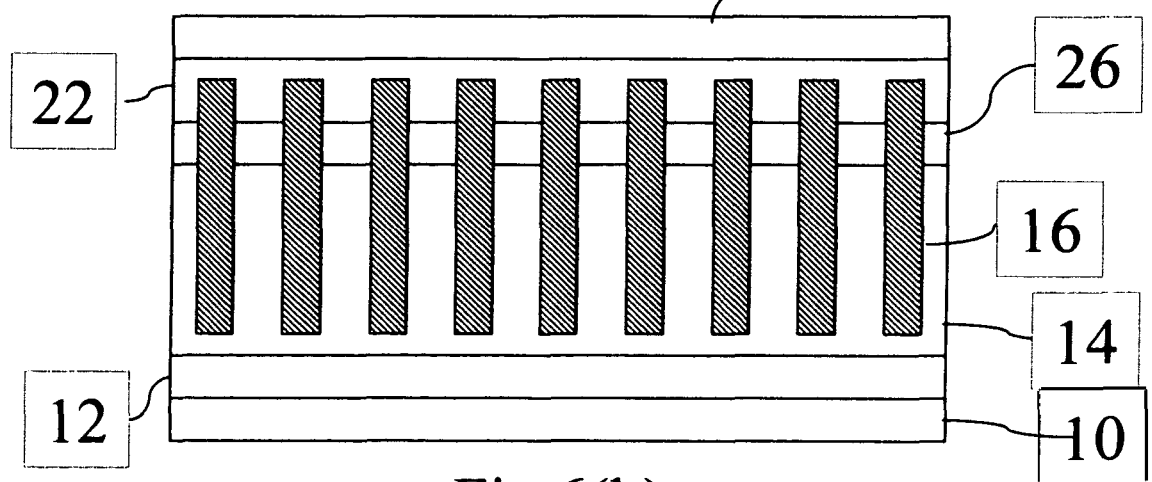

Refer to from FIG. 6(a) to FIG. 6(h) diagrams schematically showing the steps of fabricating the solar cell structure shown in FIG. 5. The steps shown in from FIG. 6(a) to FIG. 6(e) is identical to the steps shown in from FIG. 2(a) to FIG. 2(e), which have been described thereinbefore and will not repeat here. After the structure shown in FIG. 6(e) is completed, a non-conductive layer 26 is formed on the conjugate polymer layer 14 to protect the inorganic wire array 16, as shown in FIG. 6(f); then, the non-conductive layer 26 is etched to have such a thickness that the inorganic wire array 16 emerges from the non-conductive layer 26. Next, as shown in FIG. 6(g), a hole blocking layer 22 is formed on the non-conductive layer 26. Next, as shown in FIG. 6(h), an electrode layer 24 is formed on the hole blocking layer 22. Thus is completed a solar cell structure.

Figure 7A:
FIGS. 7(a)-7(d) are diagrams schematically showing an etching method for fabricating silicon nanowires according to the present invention.
Figure 7B:
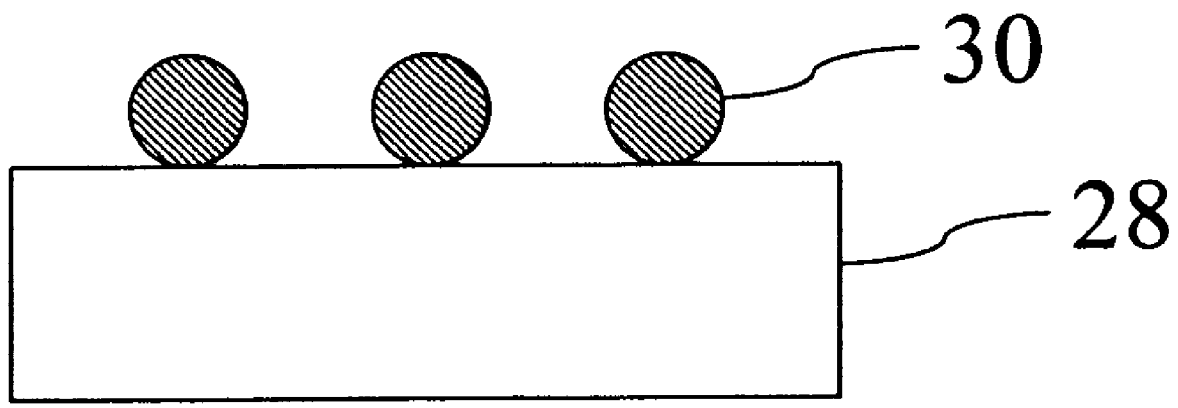
Figure 7C:
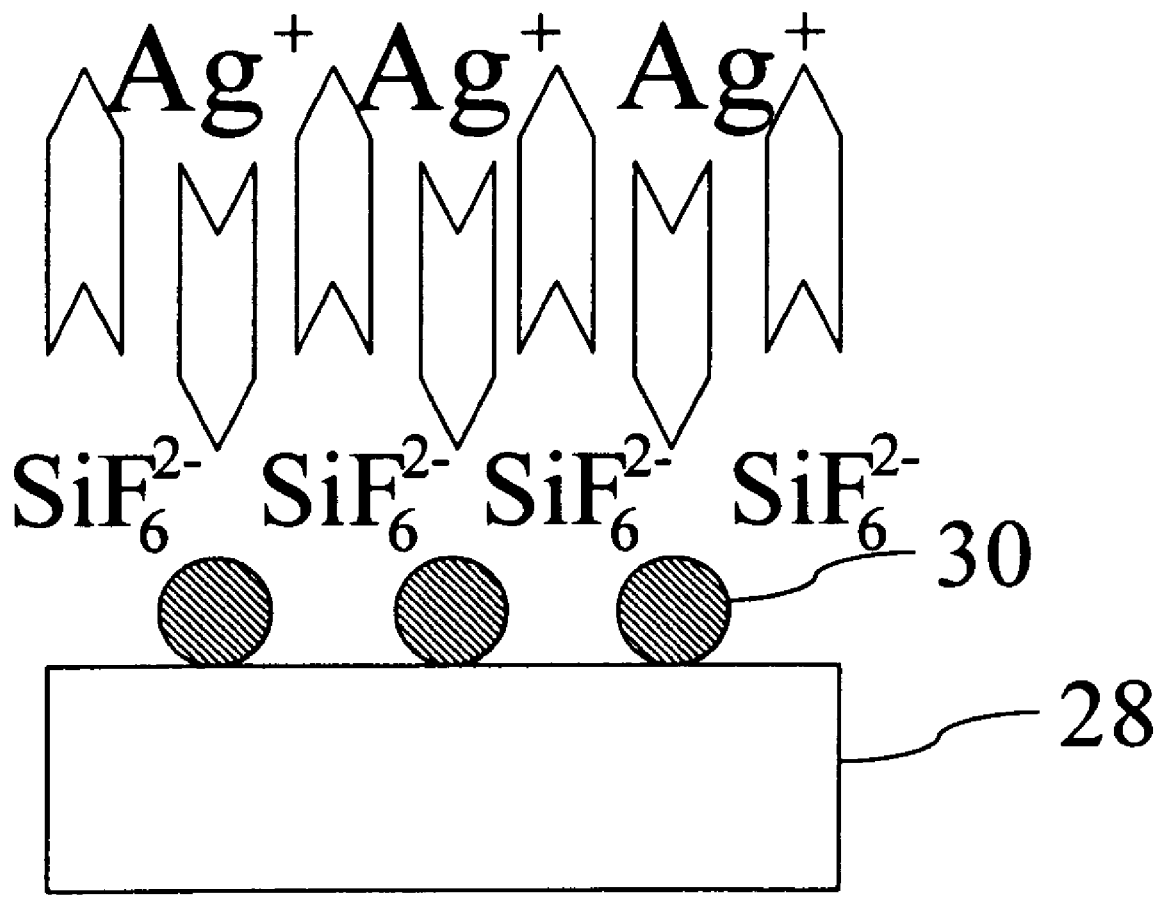
Figure 7D:
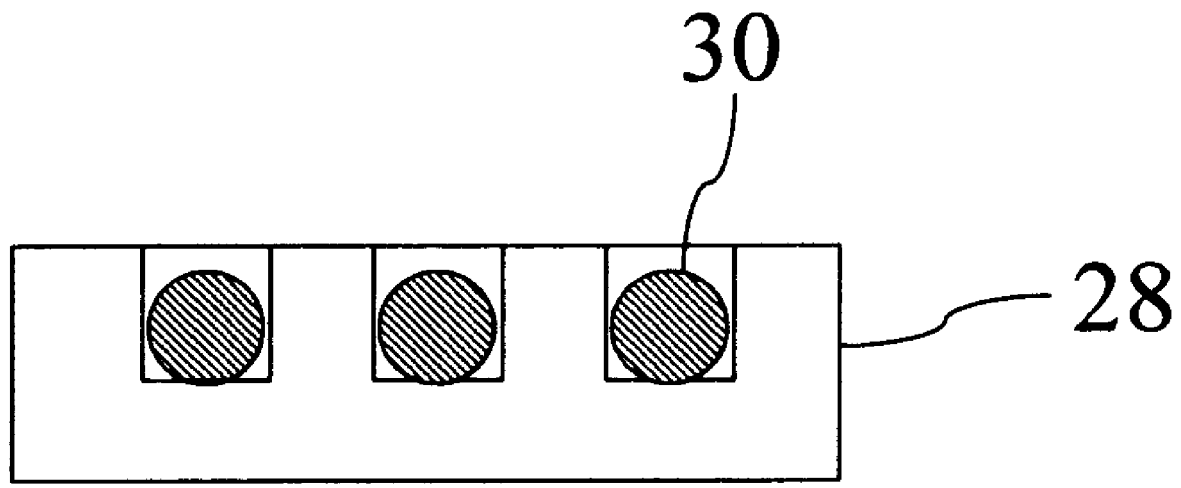

Below is described the process of fabricating an inorganic semiconductor nanowire array. Refer to from FIG. 7(a) to FIG. 7(d), wherein the process of electrochemically fabricating silicon nanowires with a wet etching method is used as an exemplification. The etching solution is a mixture of sliver nitrate solution and hydrofluoric acid. As shown in FIG. 7(a), a silicon substrate 28 is provided firstly. Next, as shown in FIG. 7(b), the silver nitrate solution electrolessly deposits silver ions 30 on the silicon substrate 28. Next, as shown in FIG. 7(c), the hydrofluoric acid etches the areas where silver ion 30 deposits. The result of etching is shown in FIG. 7(d). Thus is attained a silicon nanowire array.

In the abovementioned method, a crystalline substrate/epitaxial structure having the composition of intended nanowires is used to fabricate nanowires. Therefore, the nanowires also haves the superior quality of the crystalline substrate/epitaxial structure. Further, the original crystalline substrate can be reused to fabricate nanowires, whereby the very expensive crystalline substrate can be fully used, and the fabrication cost is greatly reduced.

Below is described in detail the process of fabricating silicon nanowires. Firstly, a silicon substrate is cleaned, wherein the silicon substrate is sequentially placed in ultrasonic vibrators respectively containing acetone, methanol, and deionized water, and the cleaning time for each ultrasonic vibrator is 5 minutes. Next, the silicon substrate is blow-dried with a nitrogen injector. Next, 0.2 grams of silver nitrate, 12 ml of hydrofluoric acid, and 40 ml of deionized water are sequentially poured into a beaker. Next, the cleaned silicon substrate is placed in the beaker and etched therein for 20 minutes. Next, the silicon substrate is taken out from the beaker, cleaned with deionized water, and then blow-dried with a nitrogen injector. Next, the silicon substrate is placed in a solution, which has nitric acid and deionized water of a ratio of 1:1, to remove the silver dendrite structure on the surface of the silicon substrate, and then the silicon substrate is taken out immediately. Next, the silicon substrate is cleaned with deionized water and blow-dried with a nitrogen injector. Next, the silicon substrate is placed in a dilute hydrofluoric solution (BOE, Buffered Oxide Etch) for 30 seconds and then taken out from the solution. Next, the silicon substrate is cleaned with deionized water and blow-dried with a nitrogen injector. Thus is completed a silicon nanowire array.

In addition to the abovementioned method, the inorganic semiconductor nanowire array may be fabrication with other methods, such as a wet etching method and a dry etching method. The wet etching method may be one of the following methods: chemical solution etching and photo-enhanced electrochemical etching. The dry etching method may be one of the following methods: RIE (Reactive Ion Etching), HDP (high-density plasma) etching, plasma etching, sputtering etching, and reactive ion beam etching. Herein, two methods to fabricate the masks of dry etching are to be introduced. One is spin-coating a silicon-dioxide nanoparticle colloidal suspension to form a monolayer of silicon dioxide nanoparticles on an inorganic substrate, wherein the viscosity of the suspension should be modified before spin-coating. The other is coating a very thin metal film on an inorganic semiconductor substrate and fast annealing the metal film to form a dry etching mask with a nanometric island pattern.

There are also other methods to fabricate ordered semiconductor nanowires, including the chemical vapor deposition method, molecular-beam epitaxy method, AAO (Anodic Aluminum Oxide) method, electrochemical method, hydrothermal method, and VLS (Vapor-Liquid-Solid) method. In the hydrothermal method, water is used as the medium; reactants and water are enclosed in a reactor and then heated and pressurized to undertake reaction; after reaction, water is filtered out to obtain the products, and then the products are cleaned and dried. Some materials sensitive to water or unstable in water are unsuitable to react in a water solution. In such a case, an organic solvent may be used as the medium, which is known as the solvothermal method. Using an organic solvent as the medium greatly expands the application field of the hydrothermal method. Sometimes, two organic solvents are used at the same time to change the polarity of the medium in the solvothermal method.

When a zinc oxide nanowire array is fabricated with the hydrothermal method, a seed layer is used as the nucleation sites, and water is used as the medium; then, the reactants are enclosed, heated and pressurized in a reactor to react and grow nanowire arrays. At present, there have been many researches about the hydrothermal method, including the size, length, and density of nanowire arrays. The hydrothermal method has the following advantages: firstly, any substrate, which zinc oxide can be spin-coated on to form a film, can be used to fabricate zinc oxide nanowires; secondly, an environment of a low temperature and the atmospheric pressure is sufficient to grow the zinc oxide nanowires. However, how to find a suitable precursor for a given nanowire is always a tough problem in the hydrothermal method. Therefore, the hydrothermal method can fabricate only few types of nanowires at present.

The VLS method proposed by Wager and Ellis in 1964 is a common method to grow III-V group or semiconductor nanowires. In the VSL method, a metallic catalyst is used as a medium to deliver vapor-phase atoms. The atoms diffuse through the liquid metal to the bottom substrate where the atoms stack to form nanowires. In the VLS method, a specified material has to be grown on a specified substrate (usually a substrate made of a similar material) lest lattice mismatch occur. In 2007, Stelzner et al. grew silicon nanowires on a silicon substrate via different metals, such as gallium, indium, aluminum and gold. In 2005, Mohan et al. used an e-beam lithography technology to grow an indium-phosphide nanowire on an indium-phosphide substrate. In 2006, Tutuc et al. coated gold on a silicon substrate and used germanium tetrahydride gas to grow germanium nanowires. In 2006, Morber et al. adopted gold as the catalyst to grow iron oxide nanowires on an aluminum oxide substrate. In 2006, Wan Qing had grown very beautiful vertical ITO (Indium Tin Oxide) nanowires on an YSZ (Yttrium-Stabilized Zirconia) substrate coated with gold. The VLS method is still studied by many researchers and extensively used to study the properties of various types of nanowires. However, the equipment thereof is very expensive and hard to mass-fabricate nanowires.

Below is to be described the process of implanting an inorganic semiconductor nanowire array into a conjugate polymer layer. Firstly, the conjugate polymer layer is heated to the Tg temperature (glass transition temperature) thereof and maintained at the temperature for a period of time. Then, the substrate having the inorganic semiconductor nanowire array is pressed onto the conjugate polymer layer at the temperature, and the state is maintained for a period of time. The time and temperature are varied with the requirements of experiments. Next, the sample is placed at the ambient temperature for a period of time to let the conjugate polymer layer cool down, and the time is varied with the requirements of experiments. Then, the substrate is separated from the inorganic semiconductor nanowire array. Thus, the inorganic semiconductor nanowire array is embedded into the conjugate polymer layer. The substrate is separated from the inorganic semiconductor nanowire array via ultrasonic vibration, slight knockings, chemical etching, or even directly lifting off the substrate. When an inorganic semiconductor nanowire array is implanted into a conjugate polymer layer, the following factors should be considered: the pressure applied onto the inorganic semiconductor nanowire array, the uniformity of the pressure, the temperature of the conjugate polymer layer, the material, length, width, spacing and distribution of the nanowires. When the pressure is too small, the nanowires are hard to be inserted into the conjugate polymer layer. When the pressure is not uniform, the nanowires cannot be completely implanted into the conjugate polymer layer. The conjugate polymer layer should be heated to a temperature higher than the Tg temperature thereof. The higher the temperature is, the easier the implantation of the nanowires is.

Figure 8:
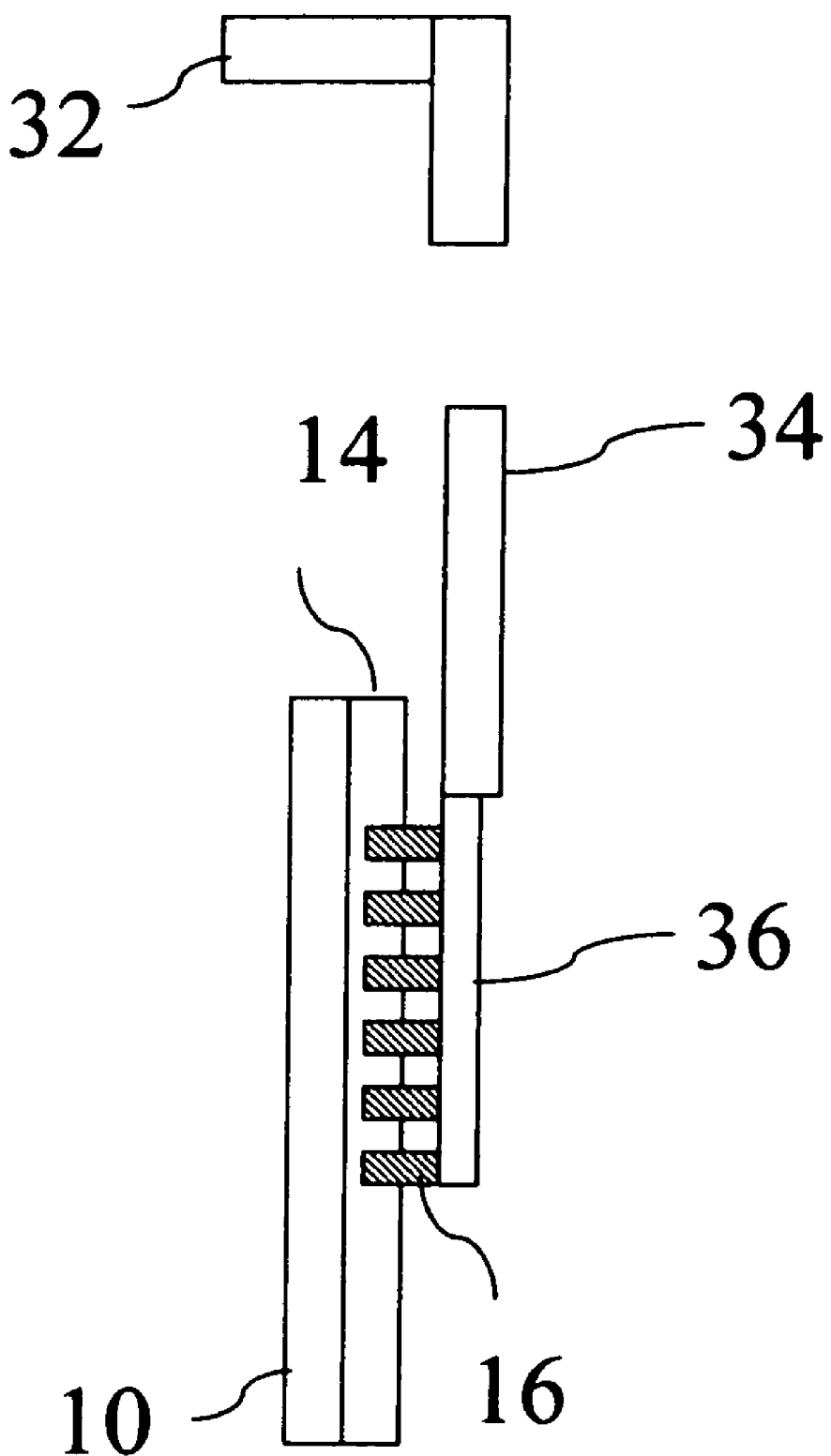
FIG. 8 is a diagram schematically showing the method of separating the chip of a silicon nanowire array from a conjugate polymer layer according to the present invention.

Below is described in detail the process of implanting an inorganic semiconductor nanowire array into a conjugate polymer layer. Refer to FIG. 8. In this embodiment, the conjugate polymer layer 14 is made of P3HT, and the conductive substrate 10 is made of an ITO glass, and the inorganic wire array 16 is exemplified by a silicon nanowire array. Firstly, the ITO glass is cleaned, wherein the ITO glass is sequentially placed in ultrasonic vibrators respectively containing acetone, methanol and deionized water, and the cleaning time for each ultrasonic vibrator is 5 minutes. Next, the ITO glass is blow-dried with a nitrogen injector. Next, 0.08 grams of P3HT is dissolved in 3 ml of dichlorbenzene, and the solution is spin-coated on the ITO glass for 60 seconds at a rotation speed of 600 rpm. Next, the coated ITO glass is placed at the ambient temperature for 30 minutes. Next, the coated ITO glass is annealed at a temperature of 160° C. for 5 minutes with a high-precision bidirectional-alignment vacuum hot-pressing machine. Next, a silicon nanowire chip 36 is pressed onto P3HT, and a plastic pad is placed over the silicon nanowire array 36. Next, the plastic pad is pressurized by a pressure of 13 kg/cm$^2$ for about 10 minutes with the high-precision bidirectional-alignment vacuum hot-pressing machine, and the upper and lower heating plates of the machine are maintained at a temperature of 160° C. Next, the sample is placed at the ambient temperature for 30 minutes. Next, a hammer 32 is used to knock an object glass 34 to separate the substrate of the silicon nanowire chip 36 from P3HT. Thus, the silicon nanowire array is implanted from the silicon nanowire chip 36 to the P3HT layer.

When the inorganic wire array is a nanometric structure, the inorganic wire array has a total width of between 300 nm and 100 m on the original semiconductor substrate; each wire of the inorganic wire array has a length of between 50 nm and 50 μm; the section, which is vertical to the original semiconductor substrate, of each wire has a width of between 5 nm and 300 nm.

In addition to being a nanometric structure, the inorganic wire array may also be a micron structure or a submicron structure. The inorganic wire may be made of one of the following materials: silicon, germanium, gallium arsenide, indium phosphide, gallium phosphide, antimony selenide, gallium antimonide, zinc telluride, and indium gallium nitride. Such a type of inorganic wire array has a total width of between 300 nm and 100 m on the original semiconductor substrate; each wire of the inorganic wire array has a length of between 50 nm and 50 μm; the spacing between two wires is below 100 μm; When the inorganic wire array is a micron structure, the section, which is vertical to the original semiconductor substrate, of each wire has a width of between 300 nm and 3000 μm.

Figure 9A:
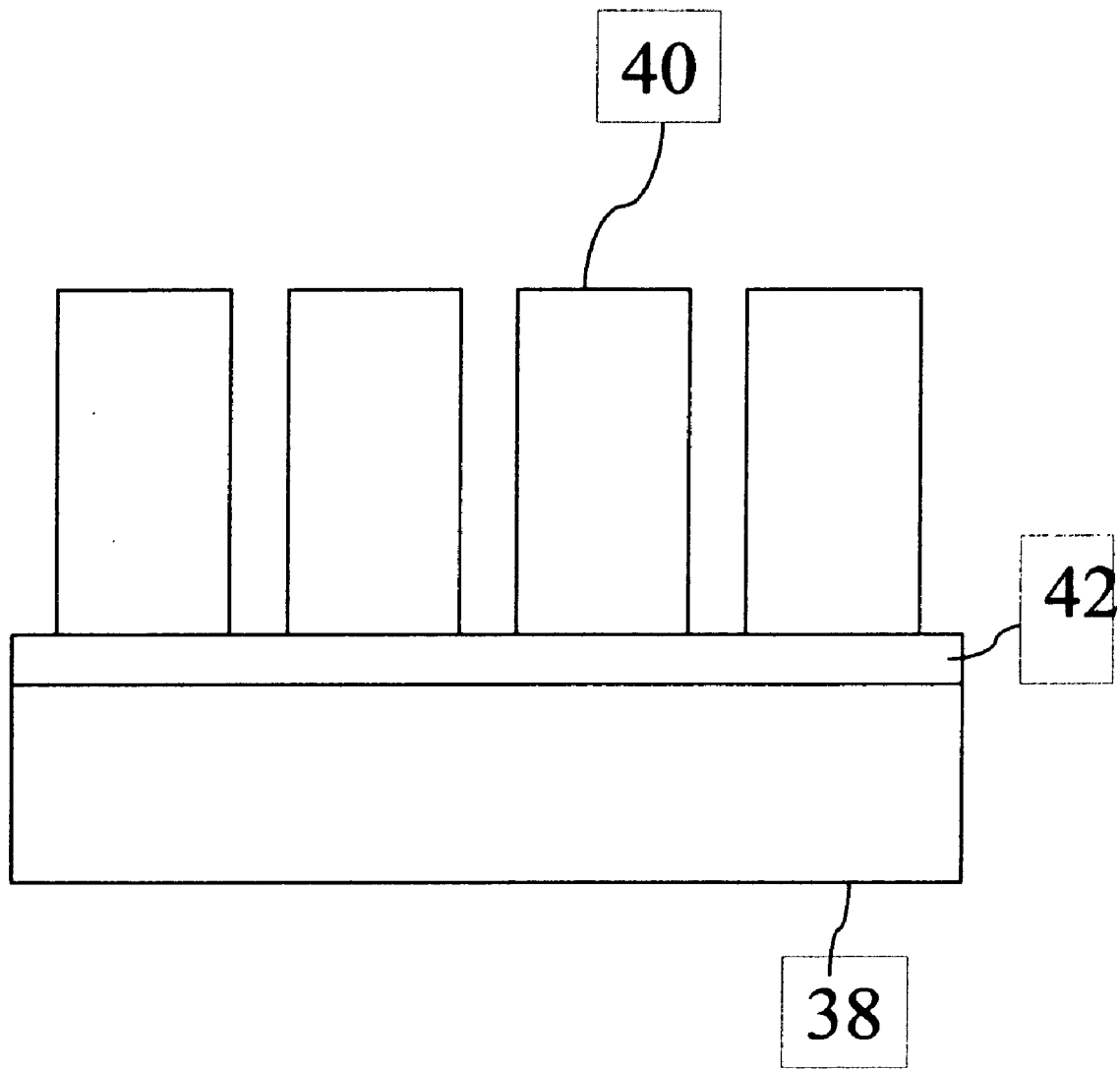
FIGS. 9(a)-9(b) are diagrams schematically showing that a selectively-etched layer is formed in between an inorganic wire array and a substrate thereof according to the present invention.

Refer to FIG. 9(a). When the nanostructure of a nanometric, micron or submicron inorganic wire array 40 has a lager section, or when the nanowires, micronwires, submicronwires or nanocolumns of the inorganic wire array 40 are very tough, ultrasonic vibration or knocking is hard to separate the inorganic wire array 40 from the original semiconductor substrate 38. In such a case, a selectively-etched layer 42 may be formed in between the wires and the original semiconductor substrate 38. The selectively-etched layer 42 will be completely etched away with a dry or wet etching method. Thus, the inorganic wire array 40 can be separated from the original semiconductor substrate 38 without seriously damaging the wire structure and the original semiconductor substrate 38.

Figure 9B:
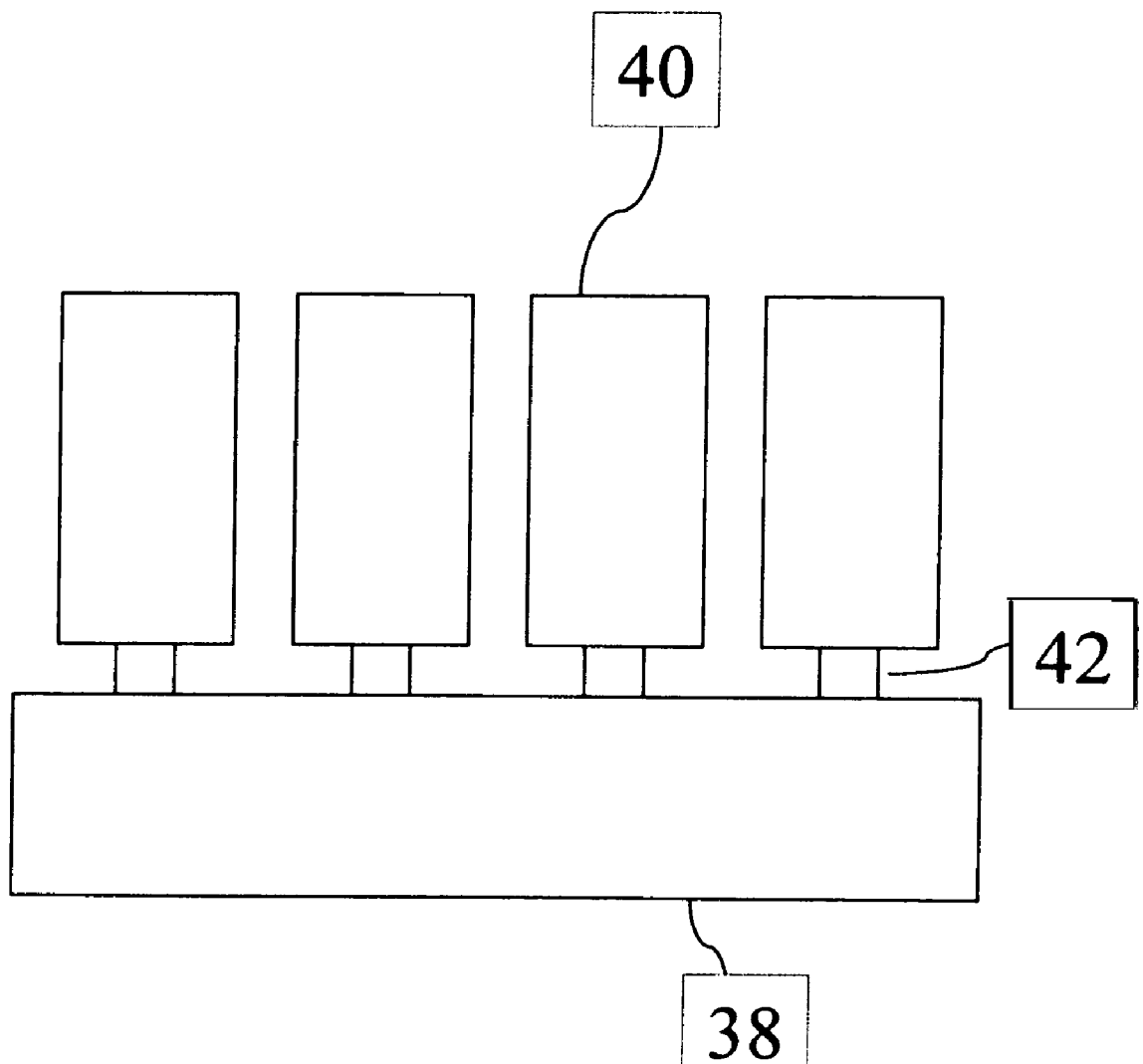

Refer to FIG. 9(b). Alternatively, the selectively-etched layer 42 is partially etched away after the step of fabricating the micron or submicron structure and the nanowires of the inorganic wire array 40 and before the succeeding steps. Thus, the nanowires, the nanocolumns, the micron structure or the submicron structure can be easily implanted to another substrate.

Figure 10:
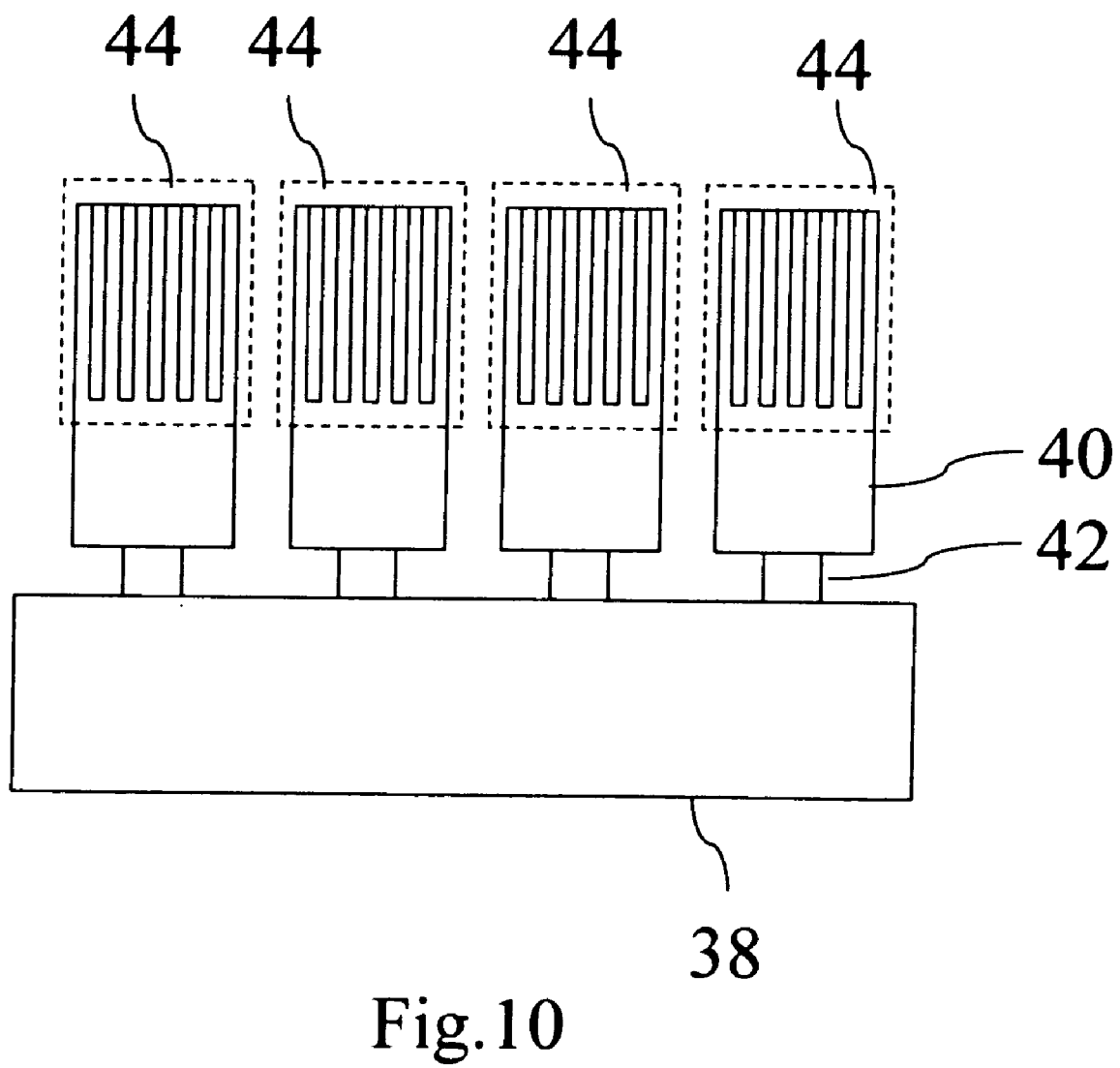
FIG. 10 is a diagram schematically showing that an inorganic wire array contains nanowire structures according to the present invention.

Refer to FIG. 10. If the contact area between the conjugate polymer layer and the micron or submicron structure of the inorganic wire array 40 is smaller, additional nanowire structures 44 may be formed on the micron or submicron structure to increase the contact area and promote the efficiency of collecting carriers.

Therefore, the solar cell structure of the present invention has flexibility, high energy conversion efficiency and a low price at the same time.

The embodiments described above are only to exemplify the present invention but not to limit the scope of the present invention. Therefore, any equivalent modification or variation according to the spirit of the present invention is to be also included within the scope of the present invention.

What is claimed is:

1. A method for fabricating a mixed-type heterojunction thin-film solar cell structure, comprising the steps of:
    providing a conductive substrate;
    providing a template, wherein said template includes a substrate and an inorganic wire array formed on said substrate;
    forming a conjugate polymer layer on said conductive substrate;
    heating said conjugate polymer layer to a glass transition temperature thereof;
    applying pressure to said inorganic wire array, thereby embedding said inorganic wire array into said conjugate polymer layer;
    separating said substrate from said inorganic wire array; and
    forming an electrode layer over said inorganic wire array and said conjugate polymer layer.

2. The method for fabricating a mixed-type heterojunction thin-film solar cell structure according to claim 1, wherein a non-conductive layer is formed in between said conjugate polymer layer and said electrode layer to protect said inorganic wire array; said non-conductive layer has such a thickness that said inorganic wire array emerging from said conjugate polymer layer is higher than said non-conductive layer; said non-conductive layer is made of a transparent material or an opaque material; said transparent material is one of following materials: PMMA (polymethylmethacrylate), SOG (Spin-On Glass), $SiO_2$ (silicon dioxide), and $Si_3N_4$ (silicon nitride).

3. The method for fabricating a mixed-type heterojunction thin-film solar cell structure according to claim 2, wherein said non-conductive layer is firstly formed over said inorganic wire array and said conjugate polymer layer, and then said non-conductive layer is etched to have such a thickness which is shorter than a height of said inorganic wire array emerging from said conjugate polymer layer, and then said electrode layer is formed over said non-conductive layer and said inorganic wire array.

4. The method for fabricating a mixed-type heterojunction thin-film solar cell structure according to claim 3, wherein said non-conductive layer is etched with a dry etching method or a wet etching method.

5. The method for fabricating a mixed-type heterojunction thin-film solar cell structure according to claim 2, wherein a hole blocking layer is formed in between said non-conductive layer and said electrode layer to cover said non-conductive layer and said inorganic wire array, said hole blocking layer is made of a material selected from a group consisting of ZnO (Zinc Oxide), $TiO_x$ (titanium oxide), PCBM ((6,6)-phenyl $C_{61}$ butyric acid methyl ester), LiF (Lithium Fluoride), a calcium compound and an alkali compound, wherein said alkali compound is $Li_2O$, $LiBO_2$, $K_2SiO_3$, or $Cs_2CO_3$.

6. The method for fabricating a mixed-type heterojunction thin-film solar cell structure according to claim 1, wherein said substrate is separated from said inorganic wire array via ultrasonic vibration, slight knockings, chemical etching, or directly lifting off said substrate.

7. The method for fabricating a mixed-type heterojunction thin-film solar cell structure according to claim 1, wherein spacing between two wires of said inorganic wire array is below two times diffusion length of excitons in polymer.

8. The method for fabricating a mixed-type heterojunction thin-film solar cell structure according to claim 1, wherein length of wires of said inorganic wire array is adjusted according to an absorption coefficient of an inorganic material of said inorganic wire array.

9. The method for fabricating a mixed-type heterojunction thin-film solar cell structure according to claim 1, wherein at least one hole transport layer or at least one electron blocking layer is formed in between said conductive substrate and said conjugate polymer layer; either of said hole transport layer and said electron blocking layer is prevented from contact with said inorganic wire array.

10. The method for fabricating a mixed-type heterojunction thin-film solar cell structure according to claim 9, wherein said hole transport layer is made of a material selected from a group consisting of PEDOT (Poly(3,4-ethylenedioxythiophene)), PEDOT:PSS (Poly(3,4-ethylenedioxythiophene)-poly(styrene sulfonate)), TFB:TPDSi$_2$ (poly[9,9-dioctylfluorene-co-N-[4-(3-methylpropyl)]-diphenylamine]:4,4'-bis[(p-trichlorosilylpropylphenyl]phenylamino]biphenyl), CuPc (copper phthalocyanine), and TNATA (4,4',4''-tris-N-naphthyl-N-phenylamino-triphenylamine); said electron-blocking layer is made of a material selected from a group consisting of TPD (N,N'-diphenyl-N,N'-di(3-methylphenyl)-1,1'-biphenyl -4,4'-diamine), BFE (poly(9,9-dioctylfluorene-co-N,N'-di(phenyl)-N,N'-di(3-carbo ethoxyphenyl)benzidine), NPB (4,4-bis[N-(1-naphthyl-1-)-N-phenyl-amino]-biphenyl), TPTE (N,N'-diphenyl-N,N'-bis(di(3-methylphenyl)aminobiphenyl)benzidine), a polycarboxy-polymer, a quaternized polyamine-polymer, a polysulphato-polymer, a polysulpho-polymer, and a poly (vinylphosphonic acid).

11. The method for fabricating a mixed-type heterojunction thin-film solar cell structure according to claim 1, wherein said inorganic wire array is a nanometric structure, a micron structure, or a submicron structure.

12. The method for fabricating a mixed-type heterojunction thin-film solar cell structure according to claim 11, wherein when said inorganic wire array is a micron structure or a submicron structure, nanowire structures are formed on said micron structure or said submicron structure to increase contact area between said conjugate polymer layer and said inorganic wire array.

13. The method for fabricating a mixed-type heterojunction thin-film solar cell structure according to claim 11, wherein when said inorganic wire array is a micron structure or a submicron structure, said inorganic wire array is made of a material selected from a group consisting of silicon, germanium, gallium arsenide, indium phosphide, gallium phosphide, antimony selenide, indium gallium nitride, a single element, a binary compound semiconductor, and a compound semiconductor containing more than two components.

14. The method for fabricating a mixed-type heterojunction thin-film solar cell structure according to claim 1, wherein a selectively-etched layer is formed in between said inorganic wire array and said substrate; said selectively-etched layer is etched away with a chemical etching method so that said substrate is separated from said inorganic wire array without seriously damaging said inorganic wire array and said substrate.

15. The method for fabricating a mixed-type heterojunction thin-film solar cell structure according to claim 14, wherein a selectively-etched layer is formed in between said substrate and said inorganic wire array, when said substrate is separated from said inorganic wire array, said selectively-etched layer is etched completely ; or said selectively-etched layer is firstly partially etched away, then, said substrate is separated from said inorganic wire array with another method.

16. The method for fabricating a mixed-type heterojunction thin-film solar cell structure according to claim 14, wherein said chemical etching method is a wet etching method or a dry etching method.

17. The method for fabricating a mixed-type heterojunction thin-film solar cell structure according to claim 1, wherein said inorganic wire array is made of a material selected from a group consisting of silicon, germanium, gallium arsenide, indium phosphide, gallium phosphide, gallium antimonide, zinc telluride, indium gallium nitride, a single element, a binary compound semiconductor, and a compound semiconductor containing more than two components; said conjugate polymer layer is made of a material selected from a group consisting of P3HT (poly-3-hexylthiophene), MEH-PPV (poly[2-methoxy-5-(2'-ethyl-hexyloxy)-1,4-phenylene vinylene]), PCPDTBT (poly[2,6-(4,4-bis-(2-ethylhexyl)-4H-cyclopenta[2,1-b;3,4-b]- dithiophene)- -alt-4,7-(2,1,3-benzothiadiazole)]), $OC_1C_{10}$-PPV (Poly[2-(3,7-dimethyloctyloxy) -5-methoxy-p -phenylene vinylene]), MDMO-PPV (poly[2-methoxy-5-(3',7'-dimethyloctyloxy) -1,4-phenylenevinylene]), and polyfluorene; said conductive substrate is made of one of following materials: a transparent conductive substrate, a transparent-electrode glass substrate, a transparent-electrode plastic substrate, a transparent-electrode quartz substrate and a thin metallic plate; said electrode layer is made of a metal, a transparent-electrode material, or a material selected from a group consisting of ITO (Indium Tin Oxide), GITO (Gallium Indium Tin Oxide), ZITO (Zinc Indium Tin Oxide), FTO (Fluorine-doped Tin Oxide), ZnO (Zinc Oxide), AZO (Aluminum Zinc Oxide) and IZO (Indium Zinc Oxide).

18. The method for fabricating a mixed-type heterojunction thin-film solar cell structure according to claim 1, wherein said inorganic wire array is fabricated with a dry etching method or a wet etching method; said dry etching method is one of following methods: plasma etching, RIE (Reactive Ion Etching), HDP (high-density plasma) etching, sputtering etching, and reactive ion beam etching; said wet etching method is one of following methods: chemical solution etching, electrochemical etching, and photo-enhanced electrochemical etching 19. The method for fabricating a mixed-type heterojunction thin-film solar cell structure according to claim 1, wherein said inorganic wire array is fabrication with one of following methods: chemical vapor deposition method, molecular-beam epitaxy method, AAO (Anodic Aluminum Oxide) method, electrochemical method, hydrothermal method, and VLS (Vapor-Liquid-Solid) method; said conjugate polymer layer is formed with one of following methods: spin coating, dip coating, inkjet printing, contact printing, screen printing, evaporation, sputtering, parylene coating, and electrochemical deposition; said electrode layer is formed with one of following methods: screen printing, vapor deposition, sputtering, and applying silver glue.

20. The method for fabricating a mixed-type heterojunction thin-film solar cell structure according to claim 1, wherein said substrate is a semiconductor substrate.

21. The method for fabricating a mixed-type heterojunction thin-film solar cell structure according to claim 1, wherein said conductive substrate does not contact said inorganic wire array.

* * * * *